(12) United States Patent  
Takase et al.

(10) Patent No.: US 9,402,040 B2  
(45) Date of Patent: Jul. 26, 2016

(54) SOLID-STATE IMAGING DEVICE

(71) Applicant: Panasonic Intellectual Property Management Co., Ltd., Osaka (JP)

(72) Inventors: Masayuki Takase, Osaka (JP); Yoshihiro Sato, Osaka (JP); Junji Hirase, Osaka (JP); Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/666,200

(22) Filed: Mar. 23, 2015

(65) Prior Publication Data

US 2015/0195466 A1    Jul. 9, 2015

Related U.S. Application Data

(63) Continuation of application No. PCT/JP2014/003235, filed on Jun. 17, 2014.

(30) Foreign Application Priority Data

Jun. 24, 2013    (JP) ................................. 2013-131787  
Jun. 6, 2014     (JP) ................................. 2014-118086

(51) Int. Cl.  
*H04N 5/369*    (2011.01)  
*G02B 13/00*    (2006.01)  
(Continued)

(52) U.S. Cl.  
CPC ............ *H04N 5/369* (2013.01); *G02B 13/0015* (2013.01); *H01L 27/14621* (2013.01);  
(Continued)

(58) Field of Classification Search  
CPC ................ G02B 13/0015; H01L 27/14621; H01L 27/14623; H01L 27/14627; H01L 27/14665; H04N 5/23212; H04N 5/369; H04N 5/3696  
See application file for complete search history.

(56) References Cited

U.S. PATENT DOCUMENTS 9,263,482 B2 *  2/2016  Doi ................... H01L 27/14665  
2008/0211954 A1 *  9/2008  Ota ................... H01L 27/14632  
                                                                348/311

(Continued)

FOREIGN PATENT DOCUMENTS

JP    2009-099817    5/2009  
JP    2009-105358    5/2009

OTHER PUBLICATIONS

International Search Report of PCT application No. PCT/JP2014/003235 dated Sep. 22, 2014.

*Primary Examiner* — Amy Hsu  
(74) *Attorney, Agent, or Firm* — McDermott Will & Emery LLP

(57) ABSTRACT

A solid-state imaging device has a plurality of imaging-purpose pixels and a plurality of focus detection-purpose pixels. Each of the imaging-purpose pixels are provided with a first lower electrode, a photoelectric conversion film formed on the first lower electrode, and an upper electrode formed on the photoelectric conversion film. Each of the focus detection-purpose pixels is provided with a second lower electrode, the photoelectric conversion film formed on the second lower electrode, and the upper electrode formed on the photoelectric conversion film. The area of the second lower electrode is smaller than the area of the first lower electrodes. The second lower electrode is provided on a position deviating from a pixel center of a corresponding focus detection-pixel, and two second lower electrodes corresponding to two focus detection purpose pixels included in the plurality of focus detection purpose pixels is arranged in mutually opposite directions.

10 Claims, 16 Drawing Sheets

(51) Int. Cl.
*H04N 5/232* (2006.01)
*H01L 27/146* (2006.01)

(52) U.S. Cl.
CPC .... *H01L27/14623* (2013.01); *H01L 27/14627* (2013.01); *H01L 27/14665* (2013.01); *H04N 5/23212* (2013.01); *H04N 5/3696* (2013.01)

(56) References Cited

U.S. PATENT DOCUMENTS

| | | | | |
|---|---|---|---|---|
| 2008/0246386 A1* | 10/2008 | Chun | ................... | H01J 9/242 313/491 |
| 2011/0006192 A1* | 1/2011 | Miyazawa | ........ | H01L 27/14609 250/208.1 |
| 2011/0019028 A1* | 1/2011 | Kimijima | ................. | G02B 7/34 348/222.1 |
| 2011/0025904 A1* | 2/2011 | Onuki | ..................... | G02B 7/34 348/360 |
| 2011/0134310 A1* | 6/2011 | Kimura | ................... | G02B 7/28 348/345 |
| 2011/0248176 A1* | 10/2011 | Mochizuki | ............. | H01L 31/18 250/370.11 |
| 2012/0182086 A1* | 7/2012 | Hase | ...................... | H03F 1/565 333/124 |
| 2013/0182173 A1* | 7/2013 | Murata | ............ | H01L 27/14605 348/349 |

* cited by examiner

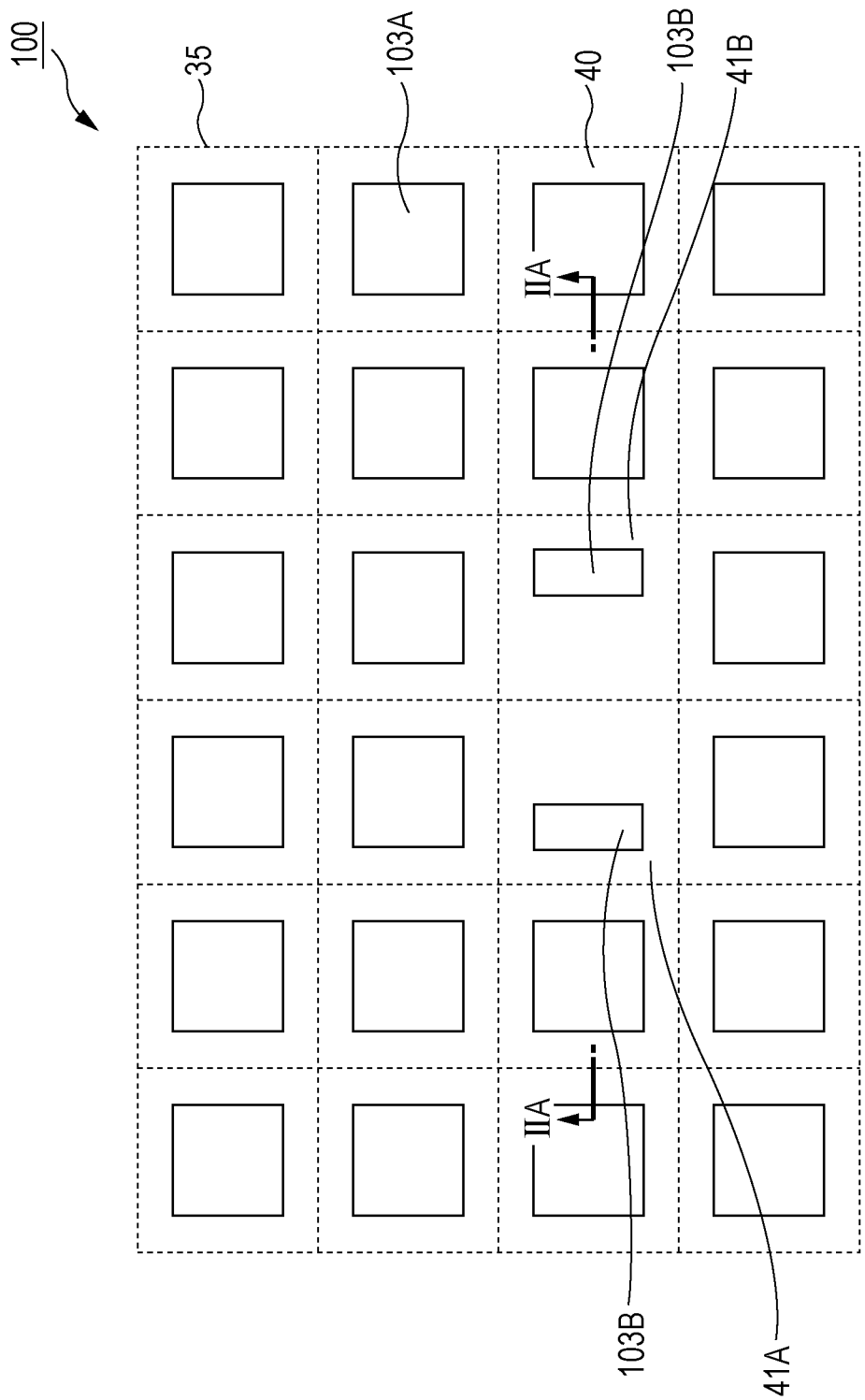

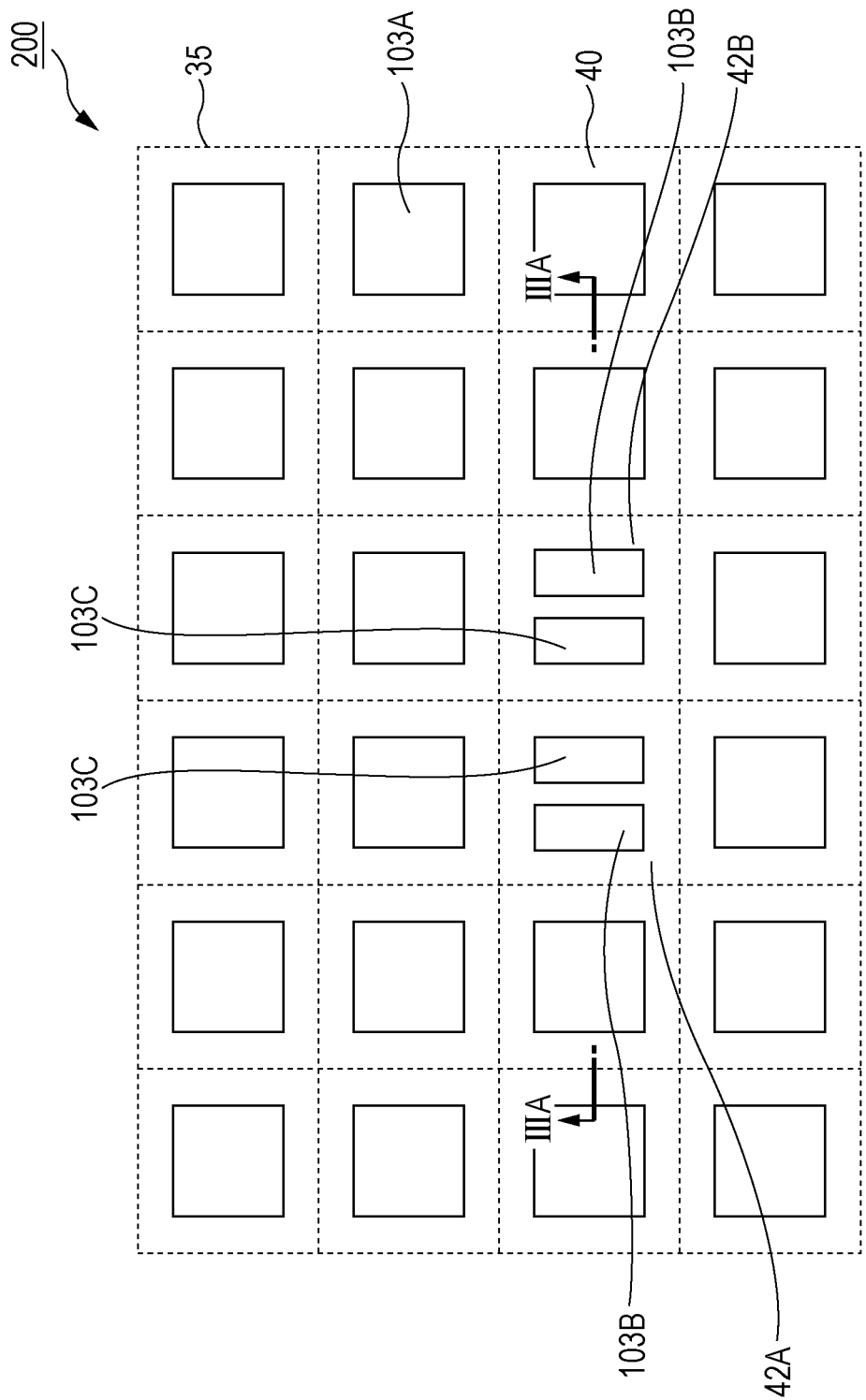

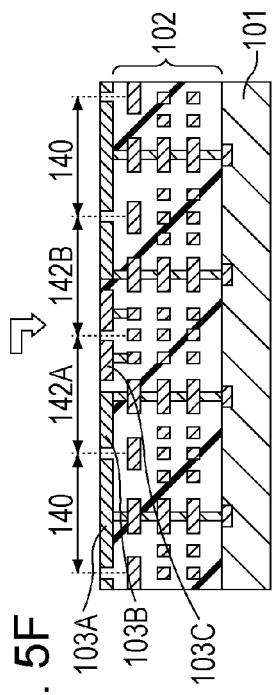
FIG. 5A
FIG. 5B
FIG. 5C
FIG. 5D
FIG. 5E
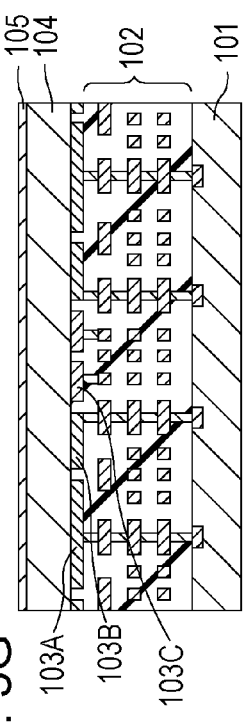
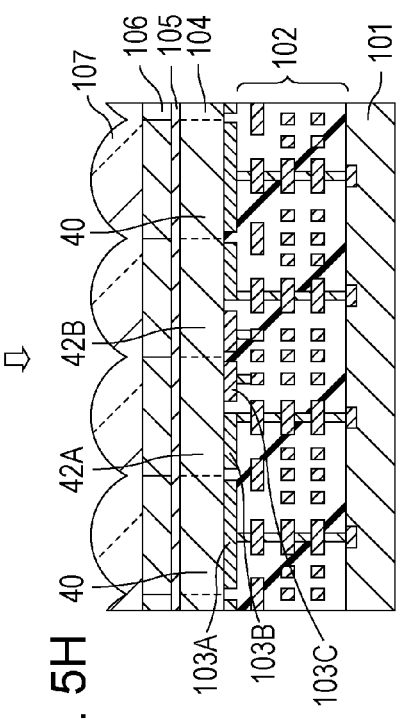
FIG. 5F
FIG. 5G
FIG. 5H

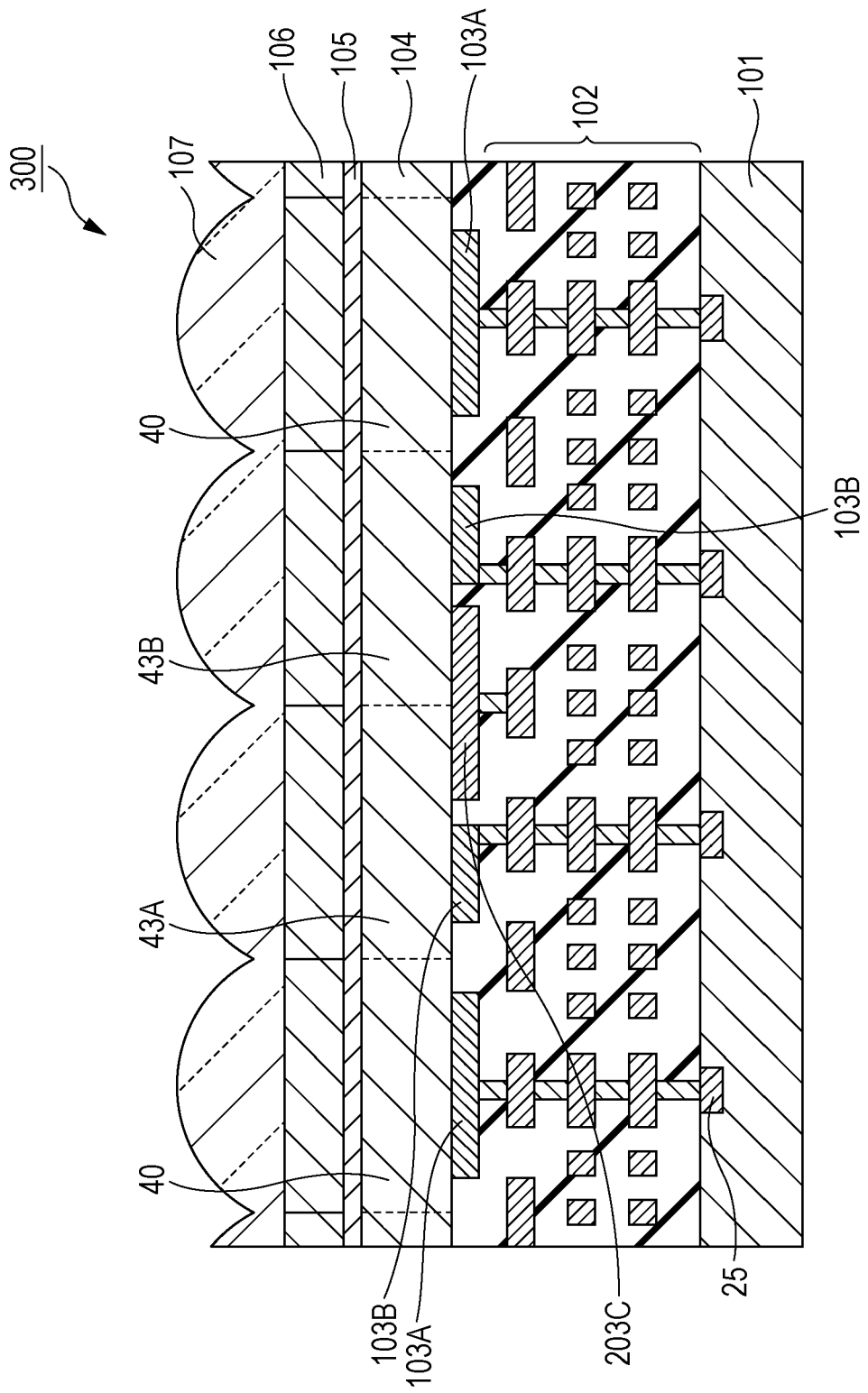

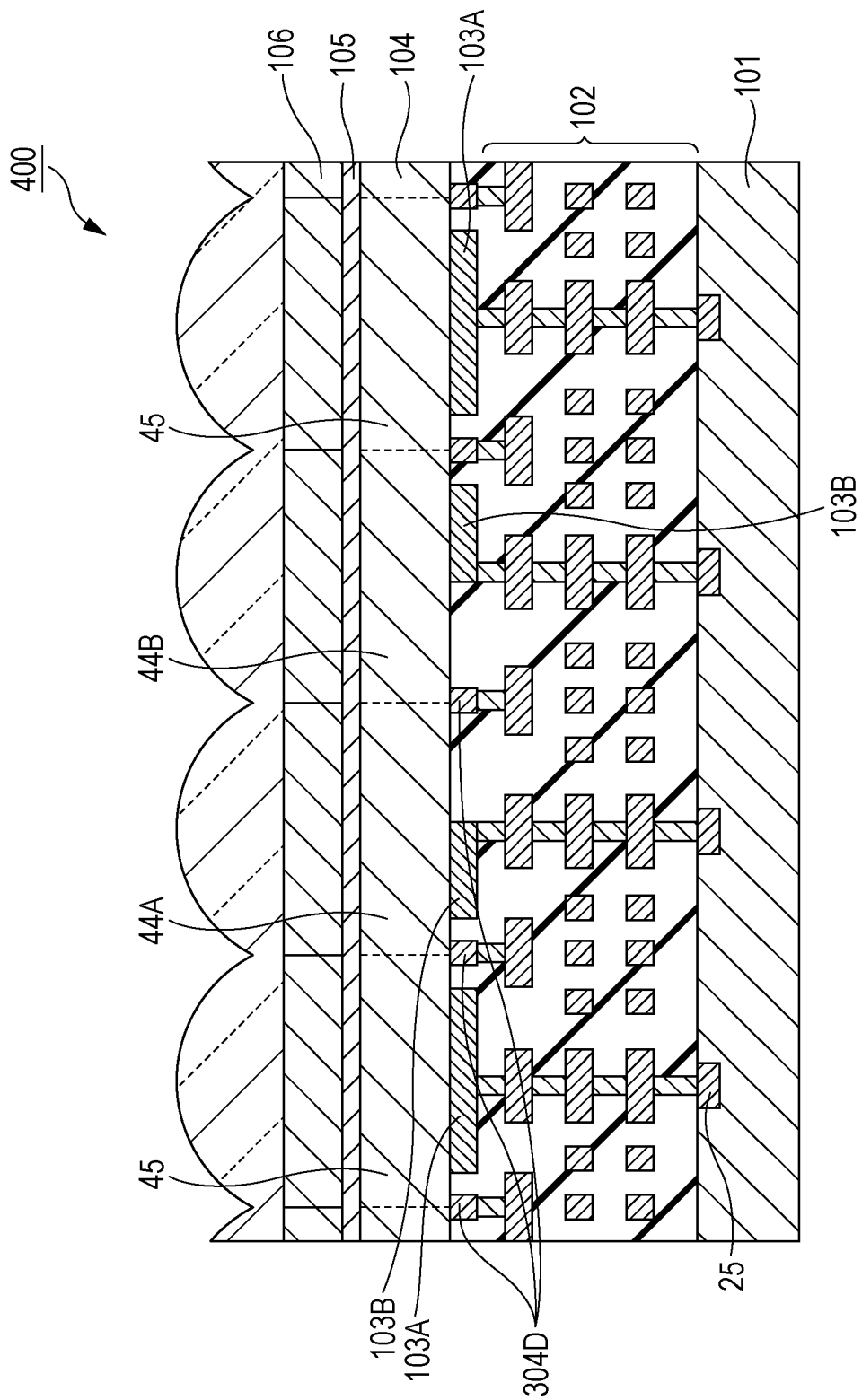

SOLID-STATE IMAGING DEVICE

BACKGROUND

1. Technical Field

The present disclosure relates to a solid-state imaging device.

2. Description of the Related Art

In order to reduce the size of a camera set and improve focus speed, a solid-state imaging device having a focus detection function has been proposed, and a phase difference detection system is known as a focus detection system.

A system has been disclosed in which, in the solid-state imaging devices presented in Japanese Unexamined Patent Application Publication No. 2009-105358 and Japanese Unexamined Patent Application Publication No. 2009-99817, approximately half of a light receiving unit (photo diode) is shielded by a light shielding band formed from a metal material or the like, and phase difference detection is thereby carried out.

SUMMARY

In one general aspect, the techniques disclosed here feature a solid-state imaging device that has an imaging region in which a plurality of pixels are arranged, in which the plurality of pixels include a plurality of imaging-purpose pixels and a plurality of focus detection-purpose pixels, each of the plurality of imaging-purpose pixels is provided with a first lower electrode, a photoelectric conversion film formed on the first lower electrode, and an upper electrode formed on the photoelectric conversion film, each of the plurality of focus detection-purpose pixels is provided with a second lower electrode, the photoelectric conversion film formed on the second lower electrode, and the upper electrode formed on the photoelectric conversion film. The area of the second lower electrode is smaller than the area of the first lower electrodes. The second lower electrode is provided on a position deviating from a pixel center of a corresponding focus detection-pixel, and two second lower electrodes corresponding to two focus detection-purpose pixels is arranged in mutually opposite directions.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2B is a drawing to explain the planar structure of the solid-state imaging device according to embodiment 1;

FIG. 3B is a drawing to explain the planar structure of the solid-state imaging device according to the modified example of embodiment 1;

FIGS. 5A to 5H are cross-sectional process flow diagrams illustrating a manufacturing method for the solid-state imaging device according to embodiment 1;

FIG. 6A is a drawing to explain the cross-sectional structure of a solid-state imaging device according to embodiment 2;

FIG. 7A is a drawing to explain the cross-sectional structure of a solid-state imaging device according to embodiment 3;

DETAILED DESCRIPTION (Findings Forming the Basis for the Present Disclosure)

Prior to describing the embodiments of a solid-state imaging device according to the present disclosure, the findings forming the basis for the present disclosure will be described.

With regard to the pixel size of an image sensor, the space available for a light receiving unit (photo diode) is limited even when the latest microfabrication techniques are used. This is because most of the pixel area is occupied by electronic components (field effect transistors and the like) required for a drive circuit.

In order to solve this problem, a solid-state imaging device in which a photoelectric conversion film is arranged on an upper layer using an organic material or the like, rather than a light receiving unit being provided on a silicon substrate, is proposed.

However, in the case where an attempt is made to apply the phase difference detection system in a solid-state imaging device provided with a photoelectric conversion film on an upper layer, as in the background art, when a light shielding band is formed on the photoelectric conversion film (light receiving unit) as a focus detection-purpose pixel, a level difference occurs on the photoelectric conversion film in the periphery of the focus detection-purpose pixel. Therefore, the forming of color filters and microlenses that are formed on the photoelectric conversion film is not uniform, and image quality characteristics deteriorate. Consequently, a technique with which it is possible to realize the phase difference detection system while also suppressing deterioration in image quality characteristics is required for a solid-state imaging device that is provided with a photoelectric conversion film on an upper layer.

Hereinafter, details of solid-state imaging devices according to the present embodiments are described with reference to the drawings. It should be noted that all of the following embodiments are for presenting specific examples of the present disclosure, and the numerical values, shapes, materials, constituent elements, and arrangement positions and connection modes of the constituent elements and the like are examples and do not limit the present disclosure.

Embodiment 1

[1. Circuit Configuration]

Figure 1:
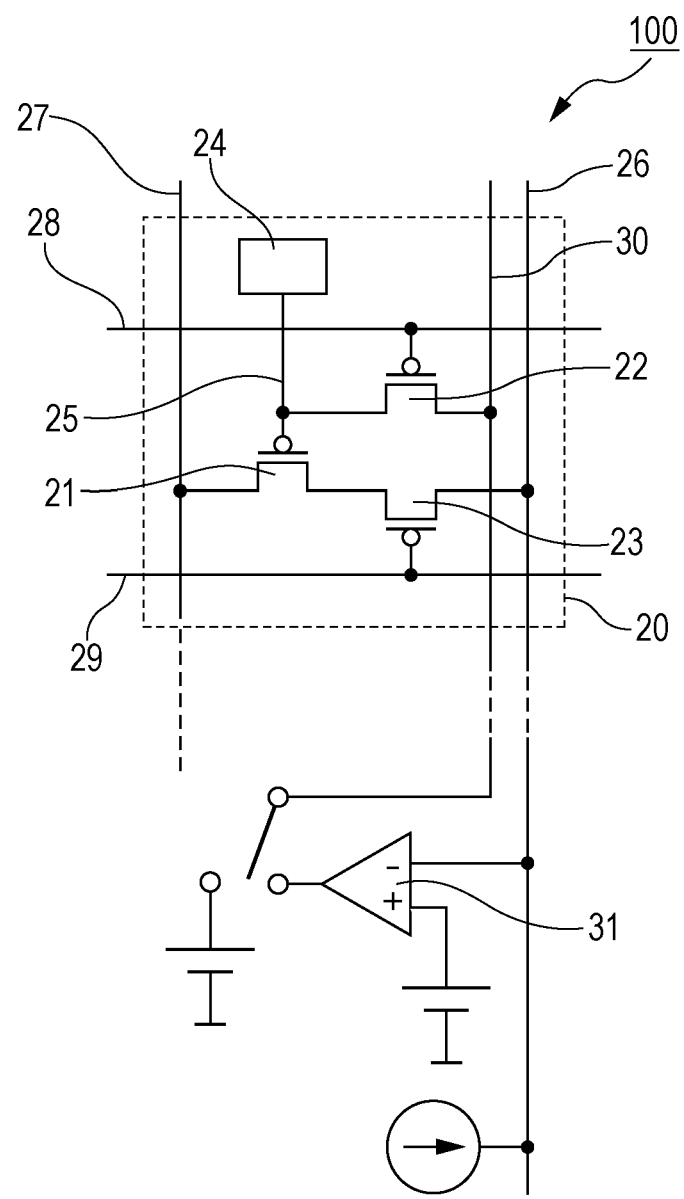
FIG. 1 is a drawing to explain the circuit configuration of a solid-state imaging device according to embodiment 1.

FIG. 1 is a drawing to explain the circuit configuration of a solid-state imaging device according to embodiment 1.

A solid-state imaging device 100 according to the present embodiment has an imaging region in which unit cells 20 are arranged in a matrix form. The unit cell 20 described in FIG. 1 is a cell constituting a repeating unit configured from an amplification transistor 21, a reset transistor 22, an address transistor 23, a photoelectric conversion element 24 which is a pixel that receives incident light (a photoelectric conversion film 104 in FIG. 2 described hereinafter), and wiring (metal wiring) that connects these, and generates a pixel signal corresponding to the incident light.

Furthermore, as depicted in the drawings (FIG. 2 and the like) described hereinafter, pixels that carry out image capturing (imaging-purpose pixels 40) and pixels for detecting focus such as autofocus (focus detection-purpose pixels 41A and 41B) are included in the photoelectric conversion element 24 (the photoelectric conversion film 104 in FIG. 2 described hereinafter) of the unit cell 20. A pixel for detecting focus is, specifically, a pixel for determining focus direction and quantity from an interval between two formed images.

Power source wiring 27 that runs in the vertical direction is connected to the source of the amplification transistor 21. A reset signal line 28 that runs in the horizontal direction is connected to the gate of the reset transistor 22, and a feedback signal line 30 that runs in the vertical direction is connected to the source. An address signal line 29 that runs in the horizontal direction is connected to the gate of the address transistor 23, and a vertical signal line 26 that runs in the vertical direction is connected to the drain.

The vertical signal line 26 is a main signal line that is arranged in each column and transmits a pixel signal to a peripheral circuit. The power source wiring 27 is arranged in each column and supplies a power source voltage to the unit cells 20 belonging to the corresponding column. The feedback signal line 30 is arranged in each column and transmits a feedback signal from the peripheral circuit to the unit cells 20 belonging to the corresponding column.

Signal charge generated by the photoelectric conversion element 24 inside the unit cell 20 is converted into voltage by charge storage nodes 25, amplified by the amplification transistor 21, and output to the vertical signal line 26 as a pixel signal. Once the pixel signal has been read out, the charge stored in the charge storage nodes 25 is reset. Here, the feedback signal line 30 and a feedback amplifier 31 are arranged on a one-to-one basis in order to negate the stored charge of random noise that remains after resetting. The vertical signal line 26 is connected to a negative input terminal of the feedback amplifier 31, and the feedback signal line 30 is connected by way of a switch to an output terminal of the feedback amplifier 31.

In the aforementioned configuration, when charge stored in the charge storage nodes 25 is reset by the reset transistor 22 (when the reset transistor 22 conducts), random noise generated in the charge storage nodes 25 is negatively fed back to the source of the reset transistor 22 via the amplification transistor 21, the address transistor 23, the vertical signal line 26, the feedback amplifier 31, which is part of the peripheral circuit, and the feedback signal line 30. Thus, a noise component of the charge storage nodes 25 is negated, and random noise can be reduced.

In other words, random noise is generated when signal charge is transferred or reset. When random noise remains when resetting, the signal charge that is next stored is added to the remaining noise, and therefore a signal on which the random noise is superimposed is output when the signal charge is read out. Accordingly, the solid-state imaging device according to the present embodiment is provided with a feedback circuit in order to remove this random noise, random noise signals that are output from each unit cell are detected, and signals are fed back to each unit cell in such a way that stored charge on which random noise is superimposed is negated.

[2. Pixel Configuration]

Figure 2A:
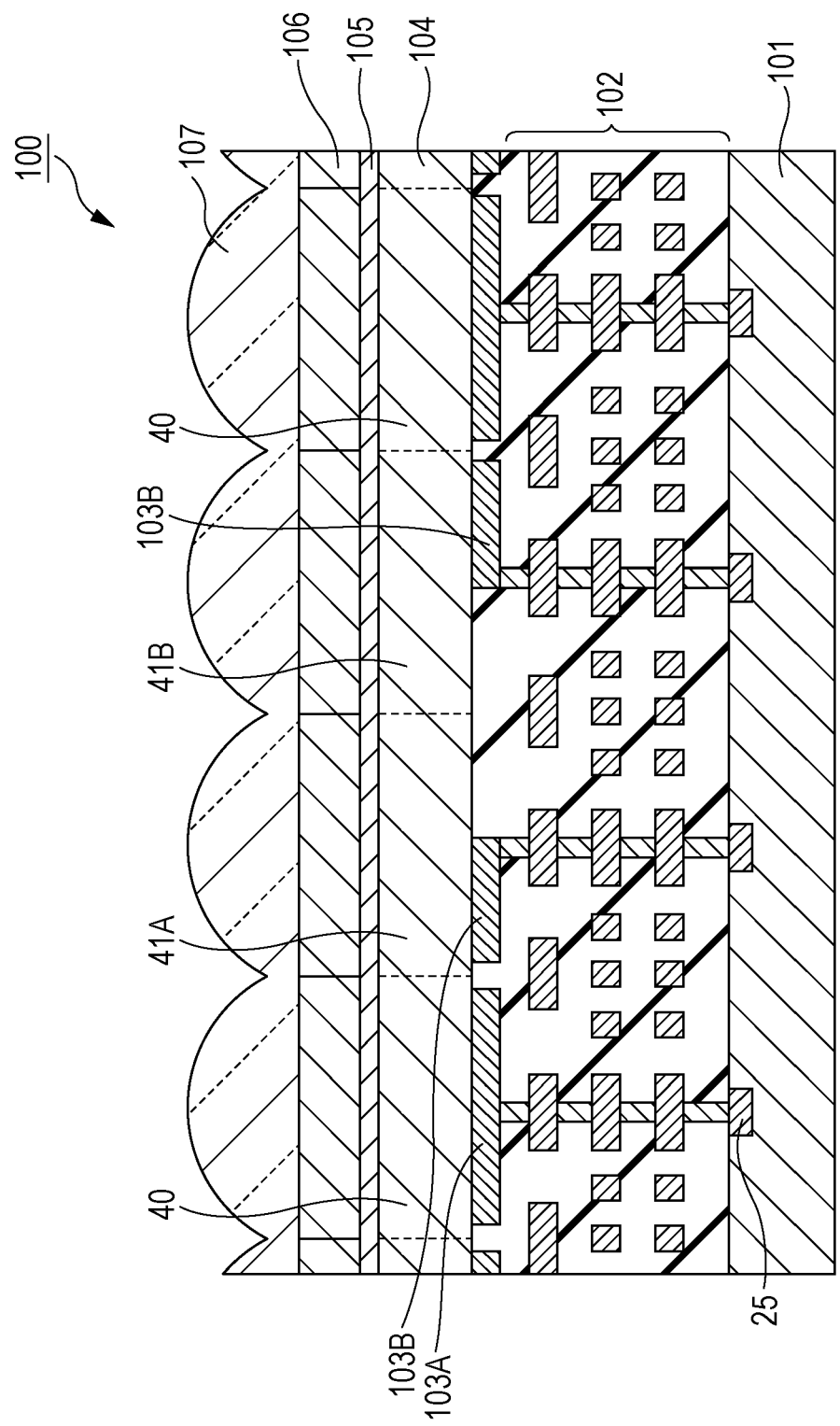
FIG. 2A is a drawing to explain the cross-sectional structure of the solid-state imaging device according to embodiment 1.

FIG. 2A is a drawing to explain the cross-sectional structure of the solid-state imaging device according to embodiment 1. In the solid-state imaging device depicted in the same drawing, a plurality of wiring layers 102 are formed on a semiconductor substrate 101. First lower electrodes 103A and second lower electrodes 103B are formed on the plurality of wiring layers 102. A photoelectric conversion film 104 is formed on the first lower electrodes 103A and the second lower electrodes 103B, and a transparent upper electrode 105 is formed on the photoelectric conversion film 104. Furthermore, color filters 106 are formed on the upper electrode 105, and microlenses 107 are formed on the color filters 106.

The solid-state imaging device 100 according to the present embodiment has a plurality of imaging-purpose pixels 40 and focus detection-purpose pixels 41A and 41B. That is, the solid-state imaging device 100 is configured from a plurality of imaging-purpose pixels and a pair of focus detection-purpose pixels.

The imaging-purpose pixels 40 are provided with the wiring layers 102 that are formed on the semiconductor substrate 101, the first lower electrodes 103A that are formed on the wiring layers 102, the photoelectric conversion film 104 that is formed on the first lower electrodes 103A, and the upper electrode 105 that is formed on the photoelectric conversion film 104. That is, the imaging-purpose pixels 40 have an imaging structure in which the photoelectric conversion film 104 is positioned between the upper electrode 105 and the first lower electrodes 103A.

The focus detection-purpose pixels 41A and 41B are each provided with the wiring layers 102 that are formed on the semiconductor substrate 101, the second lower electrodes 103B that are formed on the wiring layers 102 and have a smaller area than the first lower electrodes 103A, the photoelectric conversion film 104 that is formed on the second lower electrodes 103B, and the upper electrode 105 that is formed on the photoelectric conversion film 104. In addition, in the pair of focus detection-purpose pixels 41A and 41B constituting focus detection-purpose pixels, when the imaging region is seen in plan view, the second lower electrodes 103B are arranged eccentrically in mutually different directions from the pixel center. That is, the focus detection-purpose pixels 41A and 41B each have a focus detection structure in which the photoelectric conversion film 104 is positioned between the second lower electrodes 103B, which have a smaller area than the first lower electrodes 103A, and the upper electrode 105.

Furthermore, in the solid-state imaging device according to the present embodiment, all types of materials are able to be used as the material used for the photoelectric conversion film 104, such as an organic material or an inorganic material having high efficiency for converting from light to charge. In particular, when the photoelectric conversion film is formed from an organic material, it is possible to select the optimum material in accordance with the wavelength band of the incident light to be received, and it is therefore not necessary to adjust the film thickness and the shape of the photoelectric conversion film for each pixel. Therefore, among the pixels, it is not necessary to change the shape of the photoelectric conversion film and the shapes of the microlenses and color filters and the like peripheral to the photoelectric conversion film in accordance with the wavelength band.

In the solid-state imaging device according to the present embodiment, owing to the structure of the focus detection-purpose pixels 41A and 41B, it is not necessary to form a light shielding band from, for example, a metal material on the photoelectric conversion film 104. Therefore, since a level difference is not produced on the photoelectric conversion film 104, it is not necessary to change the shapes of the microlenses and the color filters and the like to be formed on the photoelectric conversion film 104, and it becomes possible to prevent image quality degradation with the characteristics of the imaging-purpose pixels 40 being made uniform, and to obtain a prominent effect in that focus detection can be carried out with high precision.

FIG. 2B is a drawing to explain the planar structure of the solid-state imaging device according to embodiment 1. In the same drawing, the planar structure of the first lower electrodes 103A and the second lower electrodes 103B is depicted. It should be noted that FIG. 2A is a IIA-IIA cross-sectional view of FIG. 2B. As depicted in FIG. 2B, the solid-state imaging device 100 has a configuration in which, within an imaging region 35 in which a plurality of unit cells are arranged in a planar form, some of the imaging-purpose pixels 40 are allocated to be replaced with the focus detection-purpose pixels 41A and 41B. Furthermore, although the focus detection-purpose pixels are provided in two or more locations within the imaging region 35, the focus detection-purpose pixels are not limited to two locations (one pair) and may be provided in three or more locations.

In the imaging-purpose pixels 40, charge generated by photoelectric conversion within the photoelectric conversion film 104 is accumulated in the first lower electrodes 103A due to an electric field being applied between the upper electrode 105 and the first lower electrodes 103A, and is output as a pixel signal.

The second lower electrodes 103B are provided in each of the focus detection-purpose pixels 41A and 41B, and each of the focus detection-purpose pixels 41A and 41B is connected to separate charge storage nodes 25. In the focus detection-purpose pixels 41A and 41B, charge generated in the vicinity of the second lower electrodes 103B accumulates in the second lower electrodes 103B in accordance with the electric field, and is output as a focus detection-purpose signal. On the other hand, charge generated in a region away from the second lower electrodes 103B disappears before reaching the second lower electrodes 103B due to the rejoining of electrons/holes, and a signal is therefore not detected.

Here, in the focus detection-purpose pixels 41A and 41B, when the imaging region is seen in plain view, the second lower electrodes 103B are arranged eccentrically in mutually different directions from the pixel center. Thus, it becomes possible for the amount of charge accumulated in the second lower electrode 103B of the focus detection-purpose pixel 41A and the amount of charge accumulated in the second lower electrode 103B of the focus detection-purpose pixel 41B to be, for example, different with respect to incident light from the same light source, and it becomes possible for focus detection to be performed based on the difference between these amounts of charge.

That is, in the solid-state imaging device 100 according to the present disclosure, the so-called phase difference detection system is adopted, in which incident light is divided into two left and right light beams to generate two divided images, and the pattern deviation of those two divided images is detected to determine the amount of deviation from the focus direction of a photographing lens and the focus position.

[3. Pixel Configuration of Modified Example]

Figure 3A:
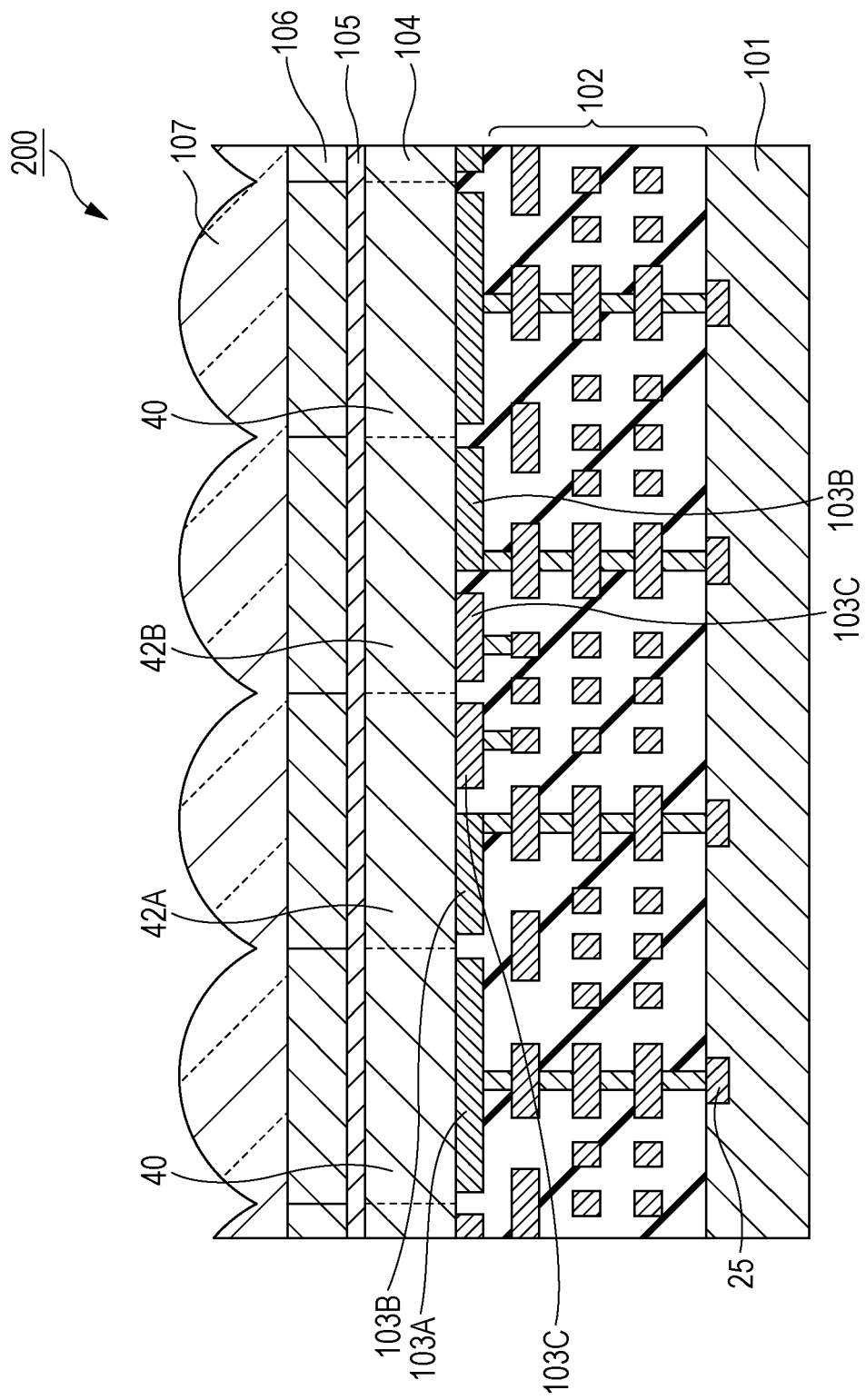
FIG. 3A is a drawing to explain the cross-sectional structure of a solid-state imaging device according to a modified example of embodiment 1.

Next, a modified example of the present embodiment is described based on FIG. 3A and FIG. 3B. Compared with the solid-state imaging device 100 according to embodiment 1, a solid-state imaging device 200 according to the present modified example has a different configuration in that third lower electrodes 103C that are different from the first lower electrodes 103A and the second lower electrodes 103B are formed in focus detection-purpose pixels 42A and 42B. Hereinafter, the configuration of the solid-state imaging device 200 is described focusing on the differences with the solid-state imaging device 100.

FIG. 3A is a drawing to explain the cross-sectional structure of the solid-state imaging device according to the modified example of embodiment 1. In the solid-state imaging device 200 depicted in the same drawing, the wiring layers 102 are formed on the semiconductor substrate 101, and the first lower electrodes 103A, the second lower electrodes 103B, and the third lower electrodes 103C are formed thereon. Furthermore, the photoelectric conversion film 104 is formed in such a way as to extend over these first lower electrodes 103A, second lower electrodes 103B, and third lower electrodes 103C. The transparent upper electrode 105 is formed on the photoelectric conversion film 104. Furthermore, the solid-state imaging device 200 according to the present modified example has the plurality of imaging-purpose pixels 40 and the focus detection-purpose pixels 42A and 42B. That is, the solid-state imaging device 200 is configured from a plurality of imaging-purpose pixels and a pair of focus detection-purpose pixels.

The imaging-purpose pixels 40 have an imaging structure in which the photoelectric conversion film 104 is positioned between the upper electrode 105 and the first lower electrodes 103A.

The focus detection-purpose pixel 42A has a focus detection structure in which the photoelectric conversion film 104 is positioned between the second lower electrodes 103B and third lower electrodes 103C and the upper electrode 105. The second lower electrodes 103B have an area that is smaller than the first lower electrodes 103A. The third lower electrodes 103C are connected to a power source or connected to ground via the wiring layers 102.

That is, each of the focus detection-purpose pixels 42A and 42B according to the present modified example, in addition to the second lower electrodes 103B, additionally has the third lower electrodes 103C, which are connected to a power source or connected to ground via the wiring layers 102, between the wiring layers 102 and the photoelectric conversion film 104.

Figure 4:
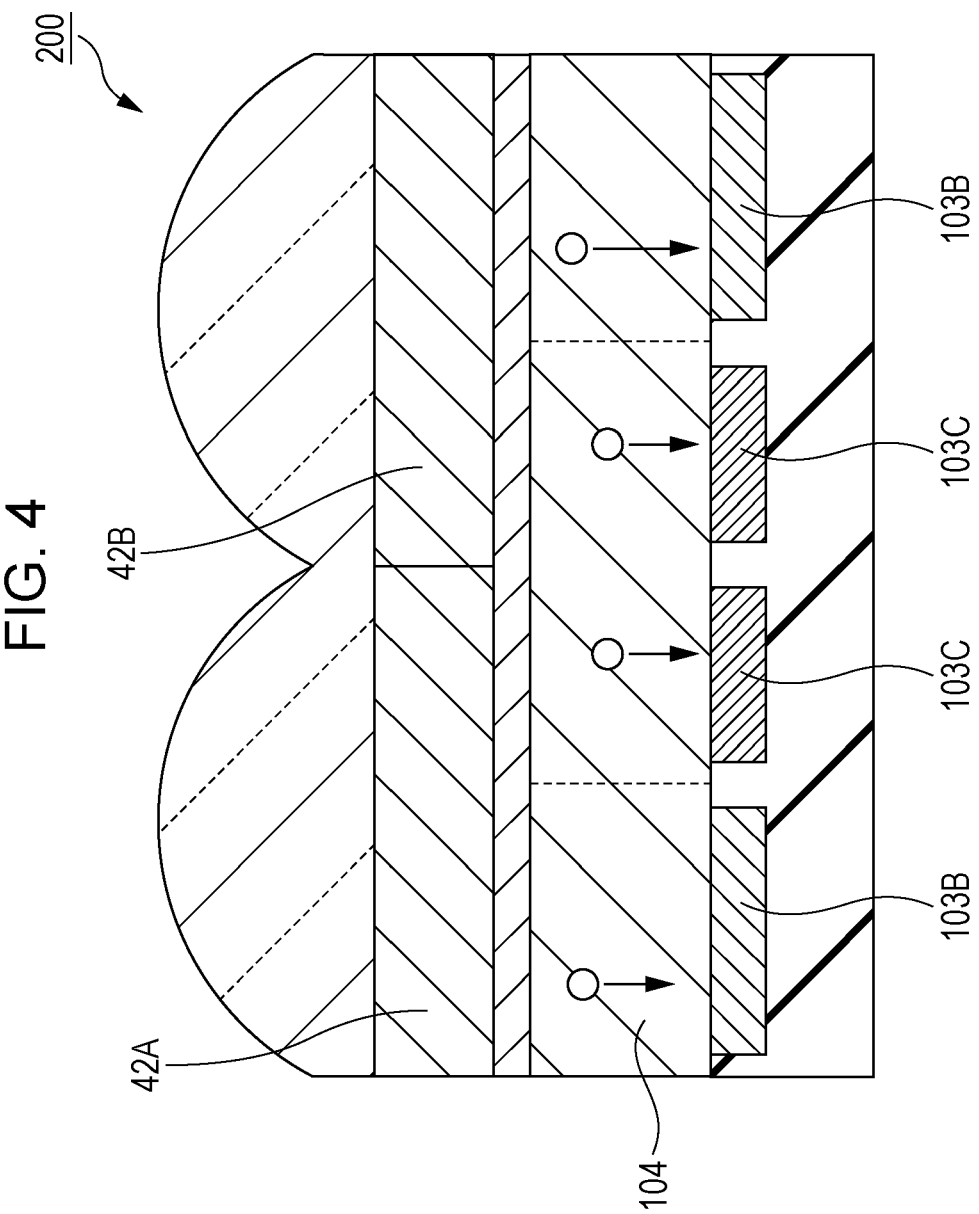
FIG. 4 is a drawing to explain the movement of photoelectric converted charge in focus detection-purpose pixels.

FIG. 3B is a drawing to explain the planar structure of the solid-state imaging device according to the modified example of embodiment 1. Specifically, the same drawing is the planar structure of the first lower electrodes 103A, the second lower electrodes 103B, and the third lower electrodes 103C. It should be noted that FIG. 3A is a IIIA-IIIA cross-sectional view of FIG. 3B. Furthermore, FIG. 4 is a drawing to explain the movement of photoelectric converted charge in the focus detection-purpose pixels. In the solid-state imaging device 200, within the imaging region 35 in which a plurality of unit cells are arranged in a planar form, some of the imaging-purpose pixels 40 are allocated to be replaced with the focus detection-purpose pixels 42A and 42B. Although the focus detection-purpose pixels are provided in two or more locations within the imaging region 35, the focus detection-purpose pixels are not limited to two locations (one pair) and may be provided in three or more locations.

The second lower electrodes 103B and the third lower electrodes 103C are provided in each of the focus detection-purpose pixels 42A and 42B, and are each connected to separate wiring. Charge generated in the vicinity of the second lower electrodes 103B accumulates in the second lower electrodes 103B in accordance with the electric field and is used as a signal for focus detection. Charge generated in the vicinity of the third lower electrodes 103C accumulates in the third lower electrodes 103C in accordance with the electric field and is discharged via power supply-purpose wiring or ground wiring. In other words, the charge in the vicinity of each of the second lower electrodes 103B accumulates in the center thereof, and focus detection precision therefore increases.

Furthermore, in embodiment 1 and the modified example thereof, it is not necessarily required for the focus detection-purpose pixels 42A and 42B to be adjacent. Furthermore, the eccentric direction from the pixel center of the second lower electrodes 103B is not limited to the aforementioned pattern. For example, in the focus detection-purpose pixel 42A, the second lower electrode 103B may be eccentric in the upward direction of the page in FIG. 2B and FIG. 3B, and in the focus detection-purpose pixel 42B, the second lower electrode 103B may be eccentric in the downward direction of the page in FIG. 2B and FIG. 3B.

[4. Manufacturing Method for Solid-State Imaging Device]

Next, a manufacturing method for the solid-state imaging device according to embodiment 1 is described.

FIGS. 5A to 5H are cross-sectional process flow diagrams illustrating a manufacturing method for the solid-state imaging device according to embodiment 1. It should be noted that, in FIGS. 5A to 5H, manufacturing steps for the solid-state imaging device 200 according to modified example 1 of the present embodiment are depicted. In contrast to this, a manufacturing method for the solid-state imaging device 100 according to the present embodiment is realized by omitting the forming step for the third lower electrodes 103C from the manufacturing steps depicted in FIGS. 5A to 5H.

First, as depicted in FIG. 5A, a plurality of signal read-out circuits are formed on the semiconductor substrate 101, and the wiring layers 102 are formed on the semiconductor substrate 101. The step depicted in FIG. 5A is carried out using a known semiconductor manufacturing process.

Next, as depicted in FIG. 5B, an insulating film 401 (for example, a silicon oxide film) is deposited on the wiring layers 102 by way of, for example, a plasma CVD (chemical vapor deposition) method. The film thickness is 50 nm or greater and 500 nm or less, for example. The insulating film 401 is an interlayer insulating film between the uppermost layer of the wiring layers 102 and the lower electrodes. A resist pattern is formed on the insulating film 401 by a lithography technique. The resist pattern is a pattern in which a portion that electrically connects the uppermost layer of the wiring layers 102 and the lower electrodes is open. Anisotropic etching such as plasma etching is then carried out, and a connecting section for the uppermost layer of the wiring layers 102 and the lower electrodes is formed.

Next, as depicted in FIG. 5C, after a metal layer 402 (for example, tungsten or the like) has been embedded in the portion in which the pattern is formed, within the insulating film 401, by way of, for example, a sputtering method or the like, planarization is carried out by way of a CMP (chemical mechanical polishing) method. A metal layer 403 is then deposited by way of the sputtering method or the like. The film thickness is 10 nm or greater and 400 nm or less, for example. The material of the metal layer 403 is, for example, copper, aluminum, titanium, tantalum, or the like.

Next, as depicted in FIG. 5D, a resist pattern is formed on the metal layer 403 by way of a lithography technique. The resist pattern is a pattern in which resists remain in portions that will become the first lower electrodes 103A, the second lower electrodes 103B, and the third lower electrodes 103G. The first lower electrodes 103A, the second lower electrodes 103B, and the third lower electrodes 103C are then formed by anisotropic etching such as plasma etching. That is, the first lower electrodes 103A, the second lower electrodes 103B, and the third lower electrodes 103C are formed from the same material in the same layer.

Here, in the present step, the first lower electrodes 103A are formed in an imaging-purpose region 140 that is on the wiring layers 102 and has each of the plurality of imaging-purpose pixels 40 formed therein. Furthermore, the second lower electrodes 103B are formed in focus detection-purpose regions 142A and 142B that are on the wiring layers 102 and have each of the focus detection-purpose pixels 41A and 41B formed therein, in such a way as to have an area that is smaller than the first lower electrodes 103A and to be arranged eccentrically in mutually different directions from the pixel center in the pair of focus detection-purpose regions 142A and 142B.

Next, as depicted in FIG. 5E, an insulating film 404 (for example, a silicon oxide film) is deposited on the first lower electrodes 103A, the second lower electrodes 103B, and the third lower electrodes 103C.

Next, as depicted in FIG. 5F, planarization is carried out by way of a CMP (chemical mechanical polishing) method, and the first lower electrodes 103A, the second lower electrodes 103B, and the third lower electrodes 103C are exposed at the front surface. The film thickness of the lower electrodes at this time is, for example, 50 nm to 200 nm.

Next, as depicted in FIG. 5G, the photoelectric conversion film 104 is formed on the first lower electrodes 103A, the second lower electrodes 103B, and the third lower electrodes 103C, and next the transparent upper electrode 105 is formed. The film thickness of the photoelectric conversion film 104 at this time is, for example, 250 nm or greater and 650 nm or less, and the film thickness of the upper electrode 105 is, for example, 50 nm or less.

Finally, as depicted in FIG. 5H, the color filters 106 are formed on the upper electrode 105, and next the microlenses 107 are formed.

Owing to the aforementioned configuration, by being equipped with the focus detection-purpose pixels 42A and 42B, the solid-state imaging device 200 according to the present modified example is able to obtain a focus detection signal by way of the phase difference detection system without a light shielding band being formed on the photoelectric conversion film 104.

In addition, if a light shielding band is formed on the photoelectric conversion film 104 in the periphery of the focus detection-purpose pixels 42A and 42B, a level difference occurs on the photoelectric conversion film in the periphery of the focus detection-purpose pixels. In contrast to this, in the solid-state imaging devices 100 and 200 according to the present embodiment, since a light shielding band is not formed on the photoelectric conversion film 104, the forming of color filters and microlenses in the periphery of the focus detection-purpose pixels can be prevented from becoming non-uniform, and image quality degradation due to non-uniformity of the characteristics of the imaging-purpose pixels 40 within the imaging region 35 can be prevented.

In addition, if a light shielding band is formed on the photoelectric conversion film 104, the characteristics of the solid-state imaging device degrade and reliability declines due to damage to the photoelectric conversion film caused by dry etching. In contrast to this, the solid-state imaging devices 100 and 200 according to the present embodiment are able to prevent the aforementioned degradation in characteristics and decline in reliability.

As described above, the solid-state imaging devices 100 and 200 according to the present embodiment, or, according to the manufacturing method for these, even a solid-state imaging device provided with the photoelectric conversion film 104, are able to carry out focus detection with high precision.

Embodiment 2

Hereinafter, with reference to the drawings, the configuration and operation of a solid-state imaging device according to embodiment 2 are described focusing on the differences with embodiment 1.

Figure 6B:
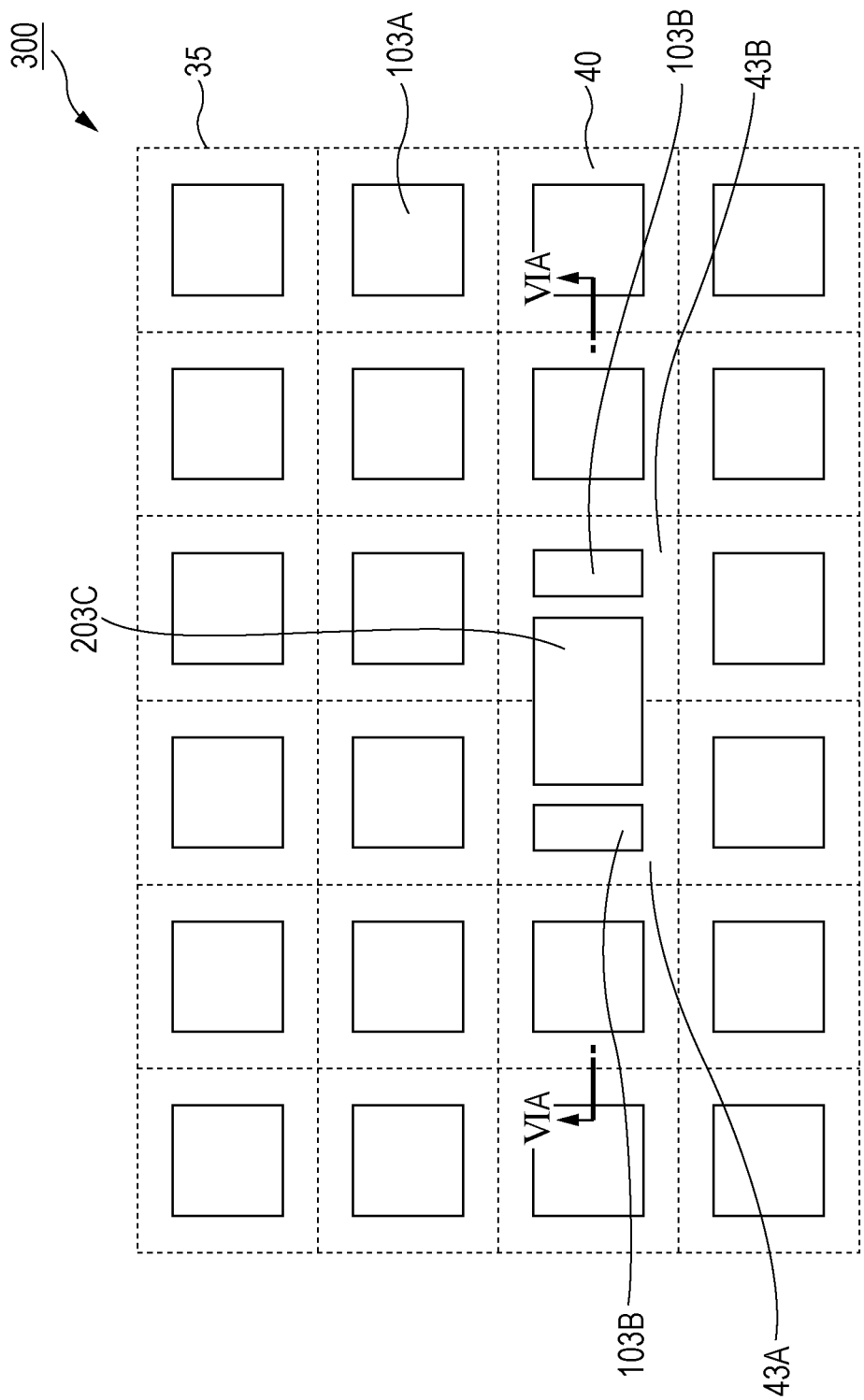
FIG. 6B is a drawing to explain the planar structure of the solid-state imaging device according to embodiment 2.

FIG. 6A is a drawing to explain the cross-sectional structure of the solid-state imaging device according to embodiment 2, and FIG. 6B is a drawing to explain the planar structure of the solid-state imaging device according to embodiment 2. It should be noted that FIG. 6A is a VIA-VIA cross-sectional view of FIG. 6B.

In a solid-state imaging device 300 according to the present embodiment, the configuration of a third lower electrode provided in adjacent focus detection-purpose pixels 43A and 43B is different from the solid-state imaging device 100 according to embodiment 1.

In the focus detection-purpose pixels 43A and 43B, charge generated by photoelectric conversion within the photoelectric conversion film 104 is accumulated in the second lower electrodes 103B or a third lower electrode 203C due to an electric field being applied between the upper electrode 105 and the second lower electrodes 103B and third lower electrode 203C, and is output as an electrical signal. Charge generated in the vicinity of the second lower electrodes 103B accumulates in the second lower electrodes 103B in accordance with the electric field, and charge generated in the vicinity of the third lower electrode 203C accumulates in the third lower electrode 203C in accordance with the electric field. The charge accumulated in the second lower electrodes 103B is used as a signal for focus detection, and the charge accumulated in the third lower electrode 203C is discharged by being connected to power supply-purpose wiring or being connected to ground.

As depicted in FIG. 6A and FIG. 6B, one third lower electrode 203C is shared between the adjacent focus detection-purpose pixels 43A and 43B. Thus, the layout is simplified and the amount of wiring and the number of power sources are reduced. Consequently, a reduction in the defect ratio can be realized while also improving operation speed.

Embodiment 3

Hereinafter, with reference to the drawings, the configuration and operation of a solid-state imaging device according to embodiment 3 are described focusing on the differences with embodiment 1.

Figure 7B:
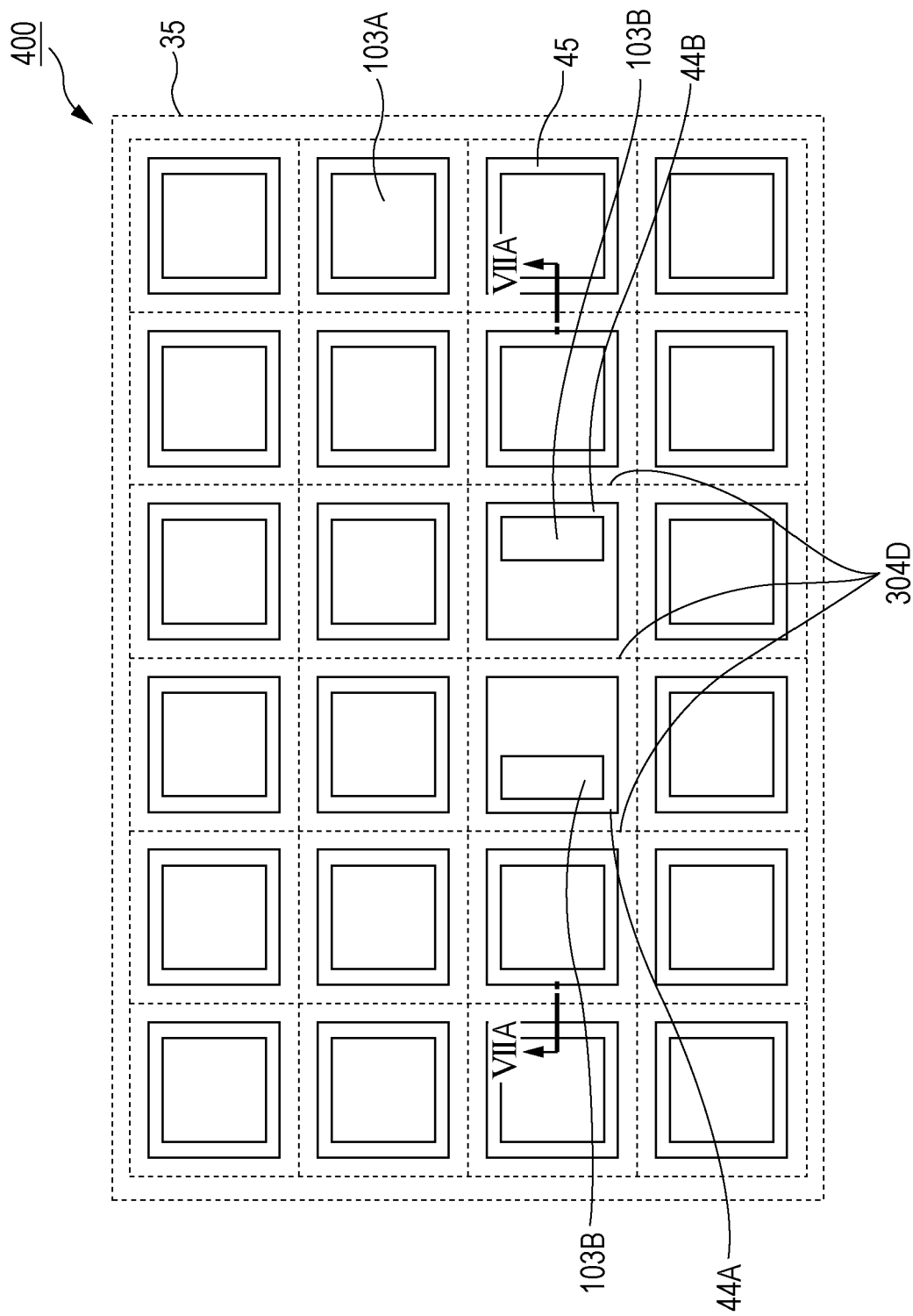
FIG. 7B is a drawing to explain the planar structure of the solid-stare imaging device according to embodiment 3.

FIG. 7A is a drawing to explain the cross-sectional structure of the solid-state imaging device according to embodiment 3, and FIG. 7B is a drawing to explain the planar structure of the solid-state imaging device according to embodiment 3. It should be noted that FIG. 7A is a VIIA-VIIA cross-sectional view of FIG. 7B.

The solid-state imaging device according to the present embodiment is different from the solid-state imaging device according to embodiment 1 in that a fourth lower electrode 304D which is common to all pixels arranged in the imaging region 35 is connected.

The fourth lower electrode 304D is a lower electrode which is between adjacent lower electrodes from among the plurality of first lower electrodes 103A and the plurality of second lower electrodes 103B, and is different from the first lower electrodes 103A and the second lower electrodes 103B.

Specifically, the fourth lower electrode 304D is arranged in a lattice form in a boundary region between imaging-purpose pixels 45 and focus detection-purpose pixels 44A and 44B. To rephrase, the fourth lower electrode 304D is arranged in such a way as to be between the plurality of first lower electrodes 103A and the plurality of second lower electrodes 103B, and to extend in at least the row direction or the column direction. Here, the fourth lower electrode 304D is a shield electrode that is connected to a power source or connected to ground via the wiring layers 102.

As depicted in FIG. 7A and FIG. 7B, by making the entire fourth lower electrode 304D common, the layout is simplified, and a reduction in the defect ratio can be realized while also being able to reduce the amount of wiring and the number of power sources.

Furthermore, as depicted in FIG. 7B, by arranging the first lower electrodes 103A and the second lower electrodes 103B of each pixel to be surrounded by the fourth lower electrode 304D, capacitive coupling between the first lower electrodes 103A and the second lower electrodes 103B of adjacent pixels can be suppressed. By employing this configuration, a substantial reduction in the effect on the signal levels of adjacent pixels can be realized. It should be noted that the fourth lower electrode 304D not only suppresses capacitive coupling but also has a function to extract charge in the vicinity of the fourth lower electrode 304D. That is, by discharging charge that is generated between adjacent pixels, the effect of suppressing optical crosstalk that occurs while incident light is arriving at the photoelectric conversion film is also obtained.

[Pixel Configuration of Modified Example]

Figure 8A:
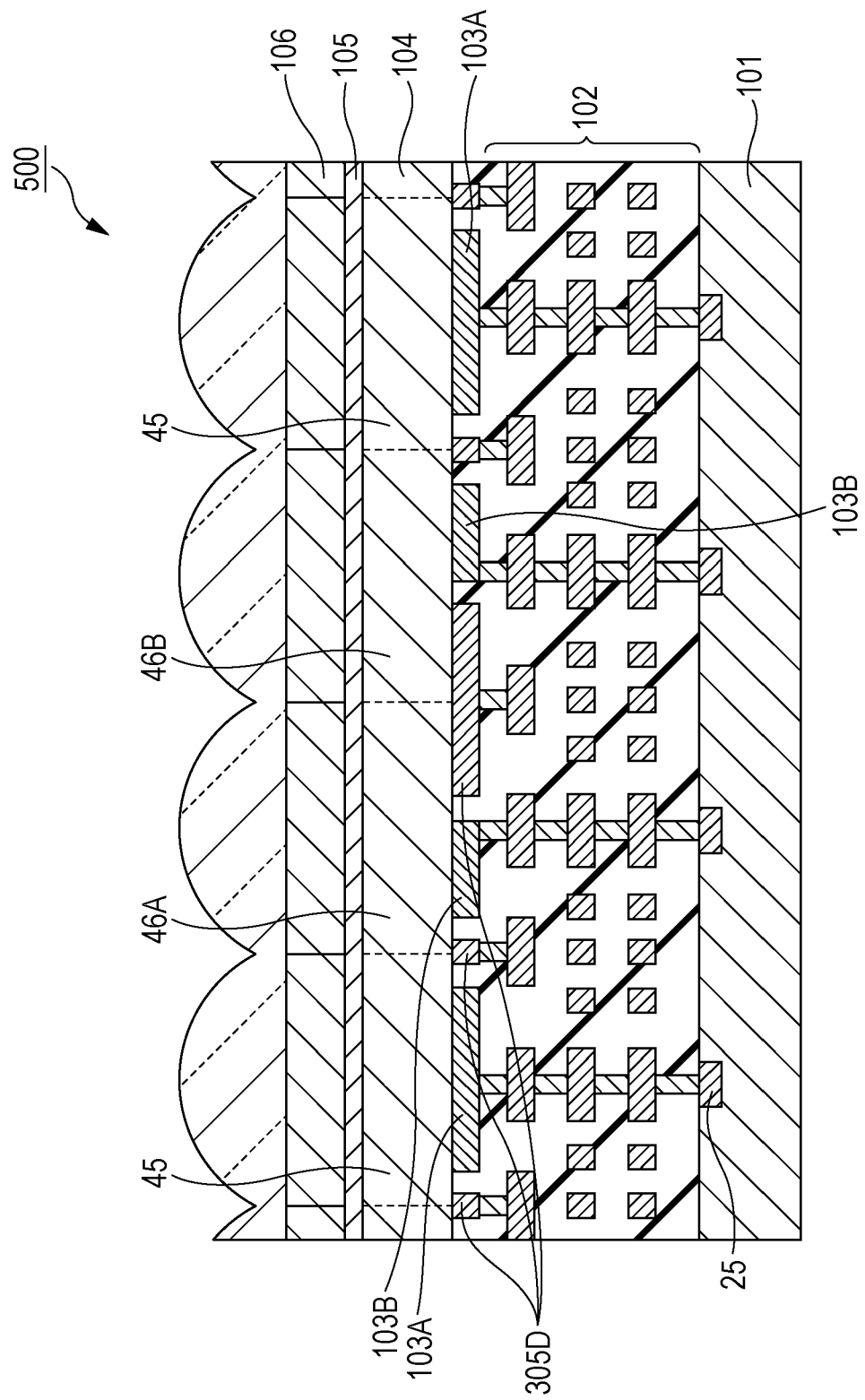
FIG. 8A is a drawing to explain the cross-sectional structure of a solid-state imaging device according to a modified example of embodiment 3.
Figure 8B:
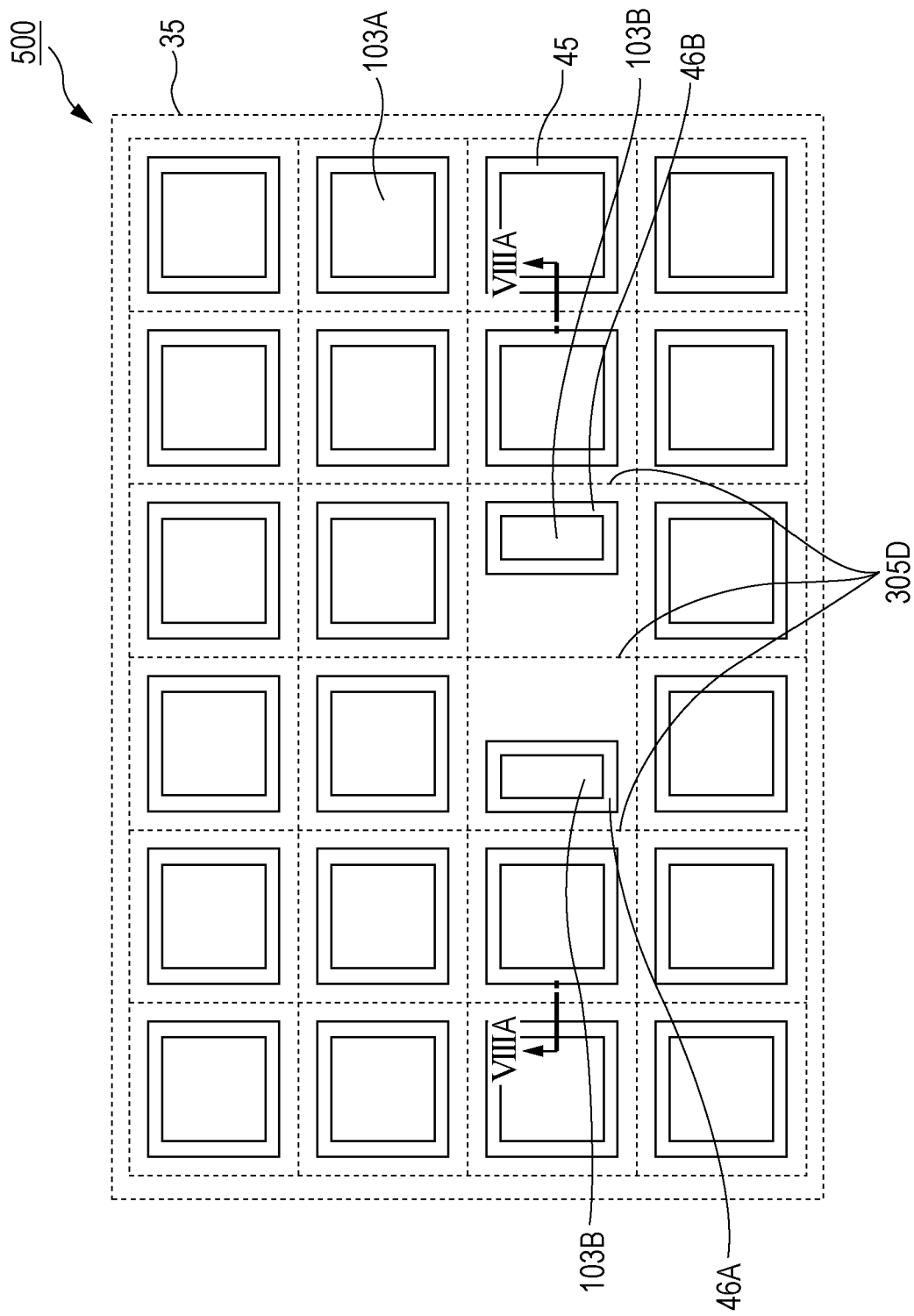
FIG. 8B is a drawing to explain the planar structure of the solid-state imaging device according to the modified example of embodiment 3.

Next, a modified example of the present embodiment is described based on FIG. 8A and FIG. 8B. Compared with the solid-state imaging device 400 according to embodiment 3, a solid-state imaging device 500 according to the present modified example has a different configuration in that the second lower electrodes 103B and a separate lower electrode that is different from the second lower electrodes 103B are formed in focus detection-purpose pixels 46A and 46B. Hereinafter, the configuration of the solid-state imaging device 500 is described focusing on the differences with the solid-state imaging device 400.

FIG. 8A is a drawing to explain the cross-sectional structure of the solid-state imaging device according to a modified example of embodiment 3, and FIG. 8B is a drawing to explain the planar structure of the solid-state imaging device according to the modified example of embodiment 3. It should be noted that FIG. 8A is a VIIIA-VIIIA cross-sectional view of FIG. 8B.

Similar to the solid-state imaging device 500 according to embodiment 3, in the solid-state imaging device 500 according to the present modified example, a fourth lower electrode 305D which is common to all pixels arranged in the imaging region 35 is connected.

The fourth lower electrode 305D is arranged in a lattice form in a boundary region between the imaging-purpose pixels 45 and the focus detection-purpose pixels 46A and 46B. To rephrase, the fourth lower electrode 305D is formed in such a way as to extend in at least the row direction or the column direction, between the plurality of first lower electrodes 103A and the plurality of second lower electrodes 103B. Here, the fourth lower electrode 305D is a shield electrode that is connected to a power source or connected to ground via the wiring layers 102.

Furthermore, the fourth lower electrode 305D is arranged also in a region in the focus detection-purpose pixels 46A and 46B in which the second lower electrodes 103B are not formed. That is, in the solid-state imaging device 500 according to the present modified example, the third lower electrodes 103C in the solid-state imaging device 200 according to the modified example of embodiment 1 and the fourth lower electrode 304D in the solid-state imaging device 400 according to embodiment 3 are not divided and are formed continuously. Thus, together with the fourth lower electrode 305D being formed and the capacitive coupling of adjacent pixels being able to be suppressed, the discharge of unwanted charge is enhanced in the focus detection-purpose pixels 46A and 46B.

Embodiment 4

Hereinafter, with reference to the drawings, the configuration and operation of a solid-state imaging device according to embodiment 4 are described focusing on the differences with embodiment 3.

Figure 9:
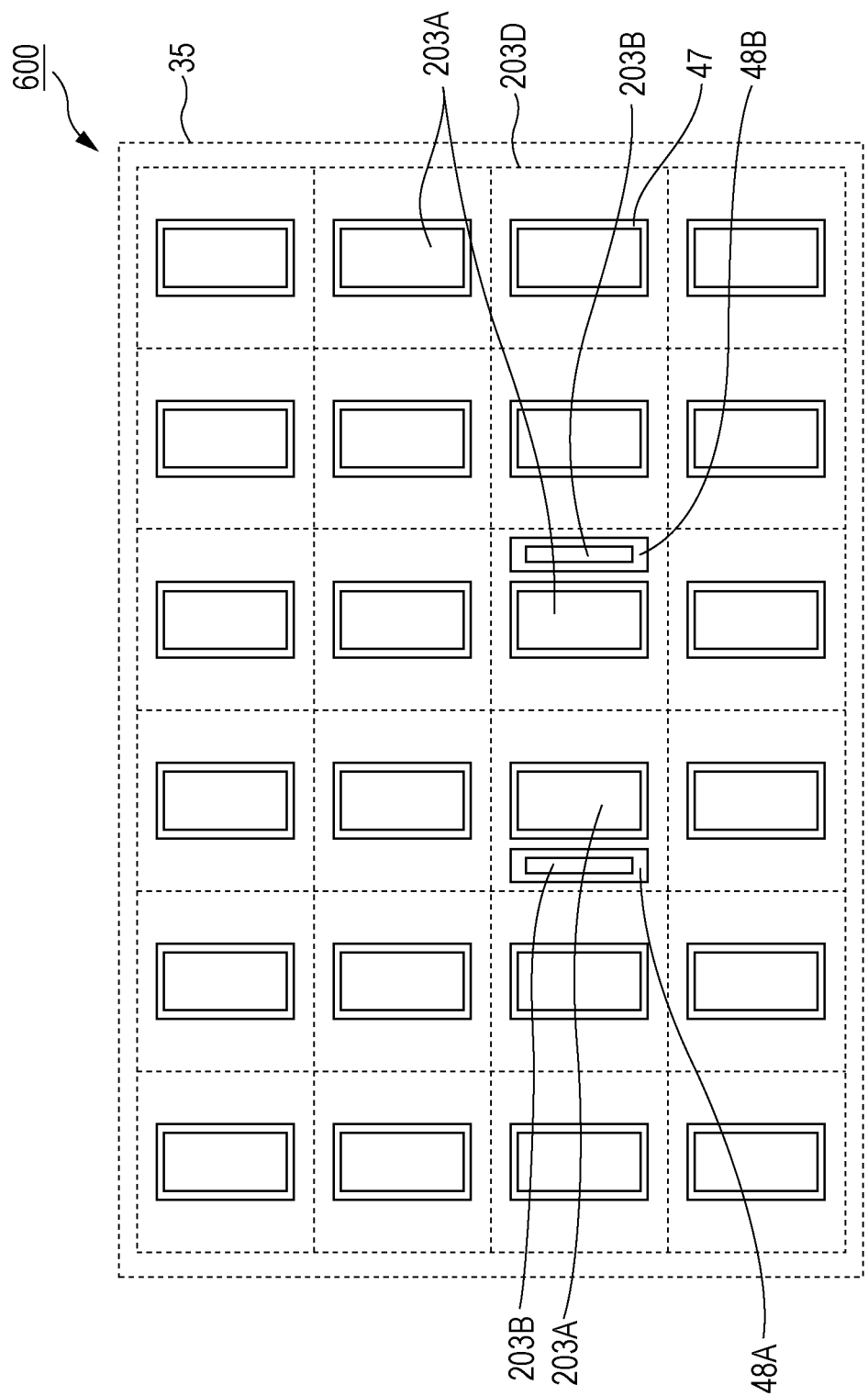
FIG. 9 is a drawing to explain the planar structure of a solid-state imaging device according to embodiment 4.

FIG. 9 is a drawing to explain the planar structure of the solid-state imaging device according to embodiment 4.

The solid-state imaging device according to the present embodiment has a different configuration compared to the solid-state imaging device 400 according to embodiment 3 in that first lower electrodes 203A arranged in imaging-purpose pixels 47 are provided in focus detection-purpose pixels 48A and 48B. Thus, the focus detection-purpose pixels 48A and 48B realize imaging and focus detection-purpose pixels that are provided with both the functions of imaging-purpose pixels and focus detection-purpose pixels. To rephrase, some of the imaging-purpose pixels from among the plurality of imaging-purpose pixels 47 are provided with a focus detection function.

The solid-state imaging device 600 according to the present embodiment has the plurality of imaging-purpose pixels 47 and the focus detection-purpose pixels 48A and 48B. That is, the solid-state imaging device 600 is configured from a plurality of imaging-purpose pixels and a plurality of focus detection-purpose pixels.

The imaging-purpose pixels 47 have an imaging structure in which the photoelectric conversion film 104 is positioned between the upper electrode 105 and the first lower electrodes 203A.

The focus detection-purpose pixels 48A and 48B each have an imaging structure and a focus detection structure in which the photoelectric conversion film 104 is positioned between the first lower electrodes 203A and second lower electrodes 203B, which have a smaller area than the first lower electrodes 203A, and the upper electrode 105. That is, the focus detection-purpose pixels 48A and 48B are provided with the second lower electrodes 203B formed between the wiring layers 102 and the photoelectric conversion film 104, and, in addition, are provided with the first lower electrodes 203A formed between the wiring layers 102 and the photoelectric conversion film 104.

A fourth lower electrode 203D is arranged in a lattice form in a boundary region between the imaging-purpose pixels 47 and the focus detection-purpose pixels 48A and 48B. Here, the fourth lower electrode 203D is a shield electrode that is connected to a power source or connected to ground via the wiring layers 102.

In embodiments 1 to 3, when some of the pixels of the imaging region 35 are replaced with focus detection-purpose pixels from imaging-purpose pixels, there is a lack of pixel information in the focus detection-purpose pixels, and therefore correction for the lacking pixels is carried out by performing pixel processing by using signal information of the imaging-purpose pixels in the periphery of the focus detection-purpose pixels to complement the lacking pixels.

In contrast to this, by adopting the configuration of the present embodiment, a configuration is possible in which there is no lack in the imaging function with the focus detection function being maintained even in the case of focus detection-purpose pixels, and it is therefore possible to realize a solid-state imaging device having a focus detection function that does not require image correction.

Embodiment 5

Hereinafter, with reference to the drawings, the configuration and operation of a solid-state imaging device according to embodiment 5 are described focusing on the differences with embodiments 1 to 4.

Figure 10:
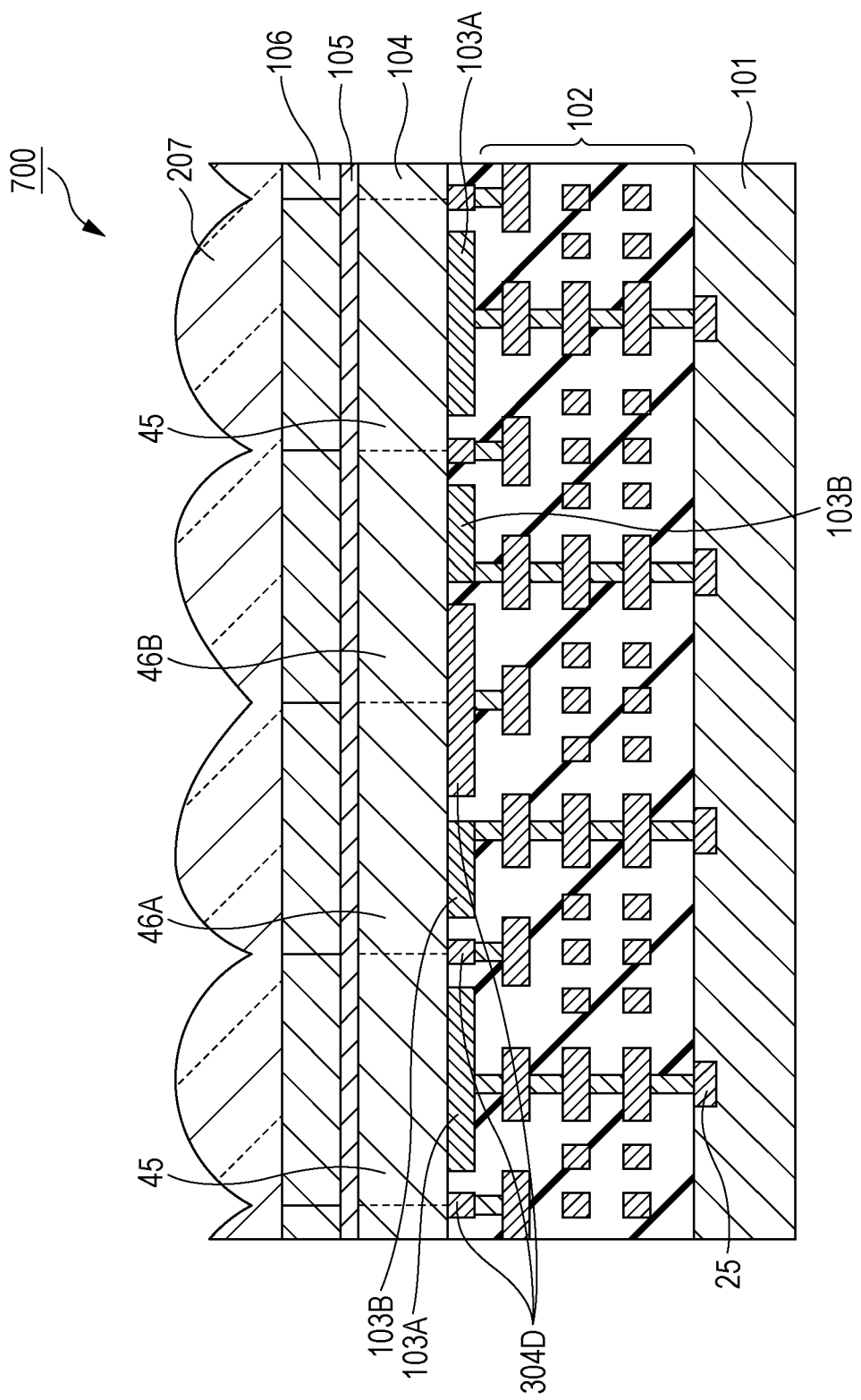
FIG. 10 is a drawing to explain the cross-sectional structure of a solid-state imaging device according to embodiment 5.

FIG. 10 is a drawing to explain the cross-sectional structure of the solid-state imaging device according to embodiment 5.

A solid-state imaging device 700 according to the present embodiment is different from the solid-state imaging devices according to embodiments 1 to 4 in that the centers of microlenses 207 on the focus detection-purpose pixels 46A and 46B are offset with respect to the center of the corresponding focus detection-purpose pixels 46A and 46B in the direction in which the second lower electrodes 103B thereof are eccentric. By doing this, a deviation occurs in the amount of charge generated in the photoelectric conversion film, within the focus detection-purpose pixels. In the present embodiment, the amount of charge in the vicinity of the second lower electrodes 103B decreases. As a result, it becomes possible for a focus detection signal received by the left and right focus detection-purpose pixels 46A and 46B to be controlled with greater precision, and an improvement in focus detection precision can therefore be realized.

It should be noted that the microlenses 207 can be formed by performing lithography using, for example, a grayscale mask (photomask) that has a different light transmittance depending on the position.

Embodiment 6

Hereinafter, with reference to the drawings, the configuration and operation of a solid-state imaging device according to embodiment 6 are described focusing on the differences with embodiments 1 to 4.

Figure 11:
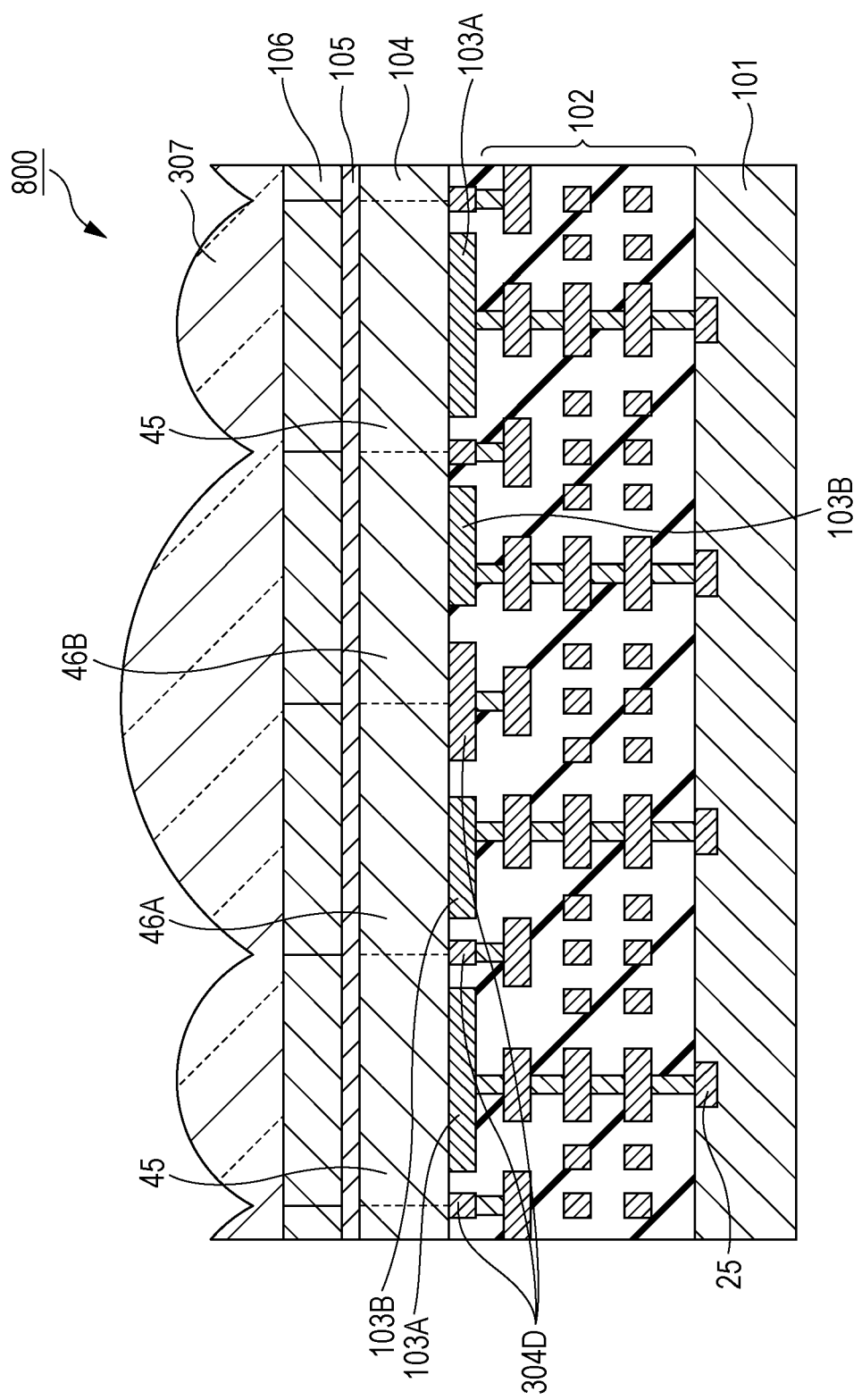
FIG. 11 is a drawing to explain the cross-sectional structure of a solid-state imaging device according to embodiment 6.

FIG. 11 is a drawing to explain the cross-sectional structure of the solid-state imaging device according to embodiment 6.

A solid-state imaging device 800 according to the present embodiment is different from the solid-state imaging devices according to embodiments 1 to 4 in that a microlens 307 on the adjacent focus detection-purpose pixels 46A and 46B is made common.

By making the microlens 307 on the adjacent focus detection-purpose pixels 46A and 46B common, the microlens on the focus detection-purpose pixels has an asymmetrical configuration, and therefore, similar to embodiment 5, an improvement in focus detection precision can be realized.

Furthermore, in the present embodiment, the planar dimension of the microlens on the focus detection-purpose pixels is large, and therefore dimensional controllability (dimensional uniformity within the imaging region) is excellent.

Furthermore, in the present embodiment, it is not necessary to use a grayscale mask; that is, an improvement in focus detection precision can be realized by a manufacturing method that is low cost due to the use of a general photomask. However, taking into consideration also realizing the other characteristics of the solid-state imaging device, a grayscale mask can also be used in an attempt to further optimize the shape of the microlens.

Advantageous Effects, Etc

As described above, an aspect of a solid-state imaging device according to the aforementioned embodiments is a solid-state imaging device that has an imaging region in which a plurality of pixels are arranged, the plurality of pixels including a plurality of imaging-purpose pixels 40 and a plurality of focus detection-purpose pixels 41A and 41B, each of the plurality of imaging-purpose pixels 40 being provided with a first lower electrode 103A, a photoelectric conversion film 104 formed on the first lower electrode 103A, and an upper electrode 105 formed on the photoelectric conversion film 104, each of the plurality of focus detection-purpose pixels 41A and 41B being provided with a second lower electrode 103B, the photoelectric conversion film 104 formed on the second lower electrode 103B, and the upper electrode 105 formed on the photoelectric conversion film 104, the second lower electrodes 103B having an area that is smaller than the first lower electrodes 103A, and the second lower electrodes 103B of each of the focus detection-purpose pixels 41A and 41B being arranged eccentrically in mutually different directions from a pixel center.

According to this, the characteristics of the imaging-purpose pixels 40 within the imaging region are made uniform and image degradation can be prevented, and focus detection can be carried out with high precision.

Here, it is desirable for the first lower electrodes and the second lower electrodes to be formed in the same layer. The front surface of the photoelectric conversion film can thereby be further planarized.

Here, each of the focus detection-purpose pixels 42A and 42B may be provided with third lower electrodes 103C that are different from the second lower electrodes 103B, and the third lower electrodes 103C may be connected to a power source or connected to ground.

Thus, the charge in the vicinity of each of the second lower electrodes 103B accumulates in the center thereof, and focus detection precision therefore increases.

Here, the plurality of focus detection-purpose pixels 43A and 43B may share a third lower electrode 203C.

Thus, the layout is simplified, and the defect ratio can be reduced.

Here, a fourth lower electrode 304D that is formed between the first lower electrodes 103A and the second lower electrodes 103B that are adjacent, and is different from the first lower electrodes 103A and the second lower electrodes 103B may be provided.

Thus, capacitive coupling between the first lower electrodes 103A and the second lower electrodes 103B can be suppressed, and it therefore becomes less likely for the first lower electrodes 103A and the second lower electrodes 103B to be mutually affected by signal level fluctuations.

Here, the third lower electrodes and the fourth lower electrode 305D may be formed continuously.

Thus, it is no longer necessary for the third lower electrodes and the fourth lower electrode to be independently connected to a power source or connected to ground.

Here, each of the focus detection-purpose pixels 48A and 48B may be provided with a first lower electrode 203A.

Thus, a solid-state imaging device having a focus detection function that does not require image correction can be realized.

Here, microlenses that are arranged on each of the focus detection-purpose pixels 46A and 46B may be provided, and the center of each of the microlenses may be offset with respect to the center of the corresponding focus detection-purpose pixel in the direction in which the second lower electrode is eccentric.

Thus, it becomes possible for a focus detection signal received by the left and right focus detection-purpose pixels 46A and 46B to be controlled with greater precision, and an improvement in focus detection precision can therefore be realized.

Here, a single shared microlens may be arranged on the focus detection-purpose pixels 46A and 46B that are adjacent.

Thus, the planar dimension of the microlens is large, and therefore dimensional controllability (dimensional uniformity within the imaging region) improves.

Here, the photoelectric conversion film 104 may be configured from an organic material.

Thus, it is not necessary to change the shape of the photoelectric conversion film and the shapes of the microlenses and color filters and the like peripheral to the photoelectric conversion film in accordance with a wavelength band.

Furthermore, an aspect of a manufacturing method for a solid-state imaging device according to the aforementioned embodiments is a manufacturing method for a solid-state imaging device that has an imaging region in which a plurality of imaging-purpose pixels 40 and a plurality of focus detection-purpose pixels 42A and 42B are arranged in a matrix fore, the manufacturing method for the solid-state imaging device including: a step in which a wiring layer 102 is formed on a semiconductor substrate; a step in which a first lower electrode 103A is formed in an imaging-purpose region 140 that is on the wiring layer 102 and has each of the plurality of imaging-purpose pixels 40 formed therein; a step in which second lower electrodes 103B are formed in focus detection-purpose regions 142A and 1428 that are on the wiring layer 102 and have each of the plurality of focus detection-purpose pixels 42A and 42B formed therein, in such a way as to have an area that is smaller than the first lower electrode 103A and to be arranged eccentrically in mutually different directions from a pixel center; a step in which a photoelectric conversion film 104 is formed on the first lower electrode 103A and on the second lower electrodes 103B; and a step in which an upper electrode 105 is formed on the photoelectric conversion film 104.

Other Embodiments

Heretofore, a solid-state imaging device of the present disclosure and a manufacturing method therefore have been described based on embodiments 1 to 6; however, the solid-state imaging device according to the present disclosure and the manufacturing method therefore are not limited to the aforementioned embodiments. Separates embodiments realized by combining any of the constituent elements in the aforementioned embodiments, modified examples obtained by carrying out various modifications conceived by a person skilled in the art without deviating from the purpose of the present disclosure with respect to the aforementioned embodiments, and various devices internally equipped with a solid-state imaging device according to the present disclosure are also included in the present disclosure.

For example, in embodiments 1 to 6, it is sufficient as long as there are two or more focus detection-purpose pixels within the imaging region 35; alternatively, the focus detection-purpose pixels do not have to be mutually adjacent as in embodiments 1 to 6. The number of focus detection-purpose pixels to be arranged and the arrangement positions thereof are determined according to the required performance and specifications of the solid-state imaging device.

A solid-state imaging device according to the present disclosure can provide a high-speed, high-precision autofocus function of a phase difference detection system without image degradation, and is useful particularly in digital cameras and the like.

What is claimed is:

1. A solid-state imaging device that has an imaging region in which a plurality of pixels are arranged, wherein
    the plurality of pixels include a plurality of imaging-purpose pixels and a plurality of focus detection-purpose pixels,
    each of the plurality of imaging-purpose pixels comprises:
    a first lower electrode;
    a photoelectric conversion film provided on the first lower electrode; and
    an upper electrode provided on the photoelectric conversion film,
    each of the plurality of focus detection-purpose pixels comprises:
    a second lower electrode;
    the photoelectric conversion film provided on the second lower electrode; and
    the upper electrode provided on the photoelectric conversion film,
    wherein the area of the second lower electrode is smaller than the area of the first lower electrode, and
    the second lower electrode is provided on a position deviating from a pixel center of a corresponding focus detection-pixel, and two second lower electrodes corresponding to two focus detection purpose pixels included in the plurality of focus detection purpose pixels is arranged in mutually opposite directions.

2. The solid-state imaging device according to claim 1, wherein the first lower electrodes and the second lower electrodes are provided in the same layer.

3. The solid-state imaging device according to claim 1, wherein each of the plurality of focus detection-purpose pixels comprises a third lower electrode that is different from the second lower electrode and is provided in the same layer as the second lower electrode, and the third lower electrode is connected to a power source or ground.

4. The solid-state imaging device according to claim 3, wherein the two focus detection-purpose pixels share the third lower electrode.

5. The solid-state imaging device according to claim 3, further comprising: a fourth lower electrode that is located such that a boundary of each of the plurality of pixels is defined.

6. The solid-state imaging device according to claim 5, wherein the fourth lower electrode is provided contiguous to the third lower electrode included in each of the plurality of focus detection-purpose pixels.

7. The solid-state imaging device according to claim 1, wherein each of the plurality of focus detection-purpose pixels includes the first lower electrode.

8. The solid-state imaging device according to claim 1, further comprising:
    microlenses that are arranged such that each of the microlenses is provided on each of the plurality of focus detection-purpose pixels,
    wherein the center of each of the microlenses is offset with respect to the center of the corresponding focus detection-purpose pixel in which the second lower electrode is provided on the position deviating from the pixel center of the corresponding focus detection-purpose pixel, in the same direction as the offset.

9. The solid-state imaging device according to claim 1, further comprising:
    a single shared microlens is arranged on one of the plurality of focus detection-purpose pixels and another one of the plurality of focus detection-purpose pixels,
    wherein the one of the plurality of focus detection-purpose pixels is adjacent to the another one of the plurality of focus detection-purpose pixels.

10. The solid-state imaging device according to claim 1, wherein the photoelectric conversion film includes an organic material.

* * * * *